United States Patent [19]
Ho et al.

[11] Patent Number: 5,990,018
[45] Date of Patent: *Nov. 23, 1999

[54] OXIDE ETCHING PROCESS USING NITROGEN PLASMA

[75] Inventors: Yu-Chun Ho; Tzu-Shih Yen; Hung-Yi Luo, all of Taipei, Taiwan

[73] Assignee: Vanguard International Semiconductor Corporation, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/712,147

[22] Filed: Sep. 11, 1996

[51] Int. Cl.$^6$ ....................... H01L 21/3065; H01L 21/311
[52] U.S. Cl. ..................... 438/723; 438/695; 438/714; 438/637
[58] Field of Search ..................... 438/637, 695, 438/723, 714

[56] References Cited

U.S. PATENT DOCUMENTS

| | | | |
|---|---|---|---|
| 5,091,326 | 2/1992 | Haskell | 438/257 |
| 5,643,407 | 7/1997 | Chang | 438/623 |

*Primary Examiner*—John F. Niebling
*Assistant Examiner*—Ha Tran Nguyen
*Attorney, Agent, or Firm*—Christensen, O'Connor, Johnson & Kincness PLLC

[57] ABSTRACT

The present invention is a method for improving an oxide etching process by using a nitrogen-based plasma. An additional nitrogen-based plasma step is used to inhibit or delay the formation of observed residual bubbles during a dry etching process. The method comprises the steps of etching the oxide layer by reactive ion etching and immersing the oxide layer in a nitrogen plasma.

18 Claims, 2 Drawing Sheets

OXIDE ETCHING PROCESS USING NITROGEN PLASMA

FIELD OF THE INVENTION

The present invention relates to oxide etching processes, and more particularly, to an improved oxide etching process having an additional nitrogen-based plasma step.

BACKGROUND OF THE INVENTION

Fluorocarbon containing plasma, such as $CF_4$, $CHF_3$, $CH_2F_2$, and $CH_3F$, is commonly used in reactive ion etching (RIE) of polysilicon, silicon nitride and oxides. Unfortunately, it has been experienced that during a RIE process, undesired byproducts and residues, such as bubbles and spots, are formed due to high humidity and basic outgas. The residual byproducts are believed to react with acid-like sidewall polymers that are easily produced in fluorocarbon plasma.

The bubbles and spots can catastrophically interfere with the operation of a semiconductor device. For example, bubbles that are formed may cause incomplete etching of polysilicon layers, thus causing short circuits. The spots also generate similar problems during interconnect fabrication. Ultimately, the spots and bubbles reduce the yield of semiconductor processes.

FIG. 1 shows a cross-sectional view of a semiconductor wafer illustrating the bubbles formed by the conventional process. Using conventional techniques, a conductive layer 12 is formed on a substrate 10. The composition of conductive layer 12 is generally polysilicon. Then, a dielectric layer 14 is formed on the conductive layer 12. The dielectric layer 14 is typically an oxide layer. Patterning a photoresist layer 16 over the dielectric layer 14 allows controlled etching of the oxide layer 14. The main etching of the oxide layer 14 is performed by a fluorocarbon containing plasma etching process with an etching gas such as $CF_4$, $CHF_3$, $CH_2F_2$, or $CH_3F$. The fluorocarbon containing plasma etching process is a reactive ion etching process. The steps above are often used in the fabrication of semiconductor devices, such as transistors and memory cells.

During the plasma etching process, the fluorine and carbon atoms of the plasma react with acid-like sidewall polymers so that bubbles 18 and spots are formed on the polysilicon layer 12. Because the bubbles 18 are formed over the polysilicon layer 12 as shown in FIG. 1, the bubbles 18 serves as a mask during later patterning of the polysilicon layer 12.

Thus, there exists a need for a reactive ion etching process using a fluorocarbon plasma that does not produce bubbles 18 or spots.

SUMMARY OF THE INVENTION

In accordance with the invention, a method for improving an oxide etching process is disclosed. The method comprises the steps of forming a conductive layer on a substrate, forming an oxide layer on said conductive layer, patterning a photoresist layer on said oxide layer, removing said oxide layer uncovered by said photoresist by reactive ion etching, and immersing said oxide layer in a nitrogen plasma. Preferably, the furnace is flushed with the nitrogen plasma for 5 to 15 seconds. This prevents the formation of bubbles and spots.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings wherein.

DETAILED DESCRIPTION OF THE PREFERRED EMBODIMENT

Figure 2:
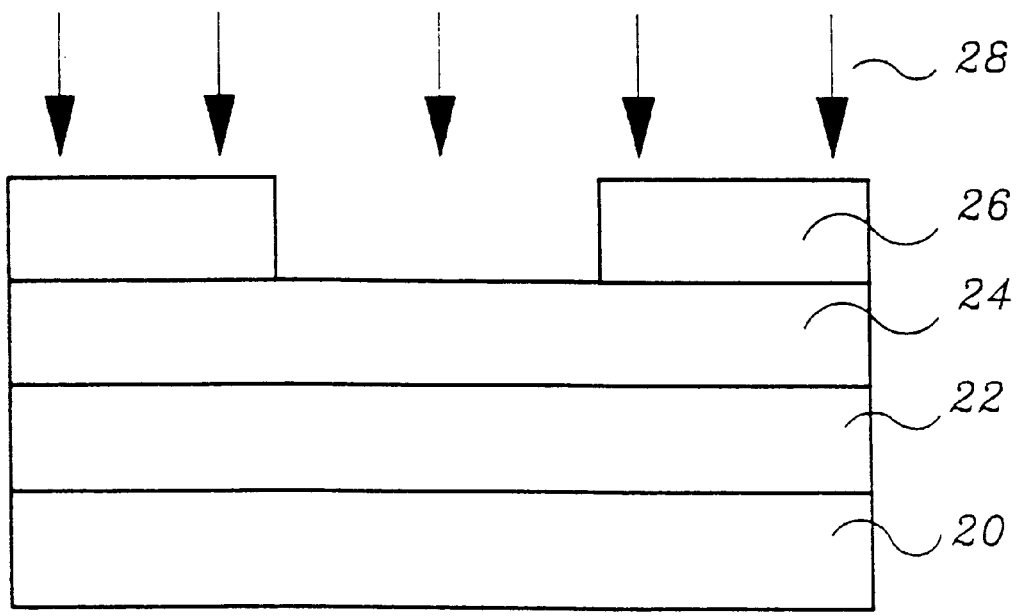
FIGS. 2–4 are cross-sectional views of a semiconductor wafer illustrating various stages of etching the oxide and polysilicon layers according to the preferred embodiment of the present invention.

FIG. 2 shows a cross-sectional view of an initial stage of RIE of an oxide and polysilicon layer in accordance with one embodiment of the present invention. Using conventional techniques, a conductive layer 22 is formed on a substrate 20. The composition of conductive layer is generally polysilicon. Then, a dielectric layer 24 is formed on the conductive layer 22. The dielectric layer 24 is typically an oxide layer. A photoresist layer 26 is then patterned over the dielectric layer 24 so that the oxide layer 24 may be selectively removed by the RIE process.

The main etching of the oxide layer 24 is performed by a fluorocarbon containing plasma etching process with an etching gas such as $CF_4$, $CHF_3$, $CH_2F_2$, or $CH_3F$, which is indicated by arrows 28. The fluorocarbon containing plasma etching process is a reactive ion etching process. After this main etching 28 of the oxide layer 24, an optional over-etching step is performed. Whether or not an over-etching step is performed is dependent on the particular semiconductor process. The optional over-etching step functions to remove residues. The over-etching step uses a high selectivity etch relative to the to the underlying conductive layer 22. In the preferred embodiment, the over-etching step is performed using a selective etching process with a selectivity ratio of about 25 for the dielectric layer 24 to the conductive layer 22.

Figure 1:
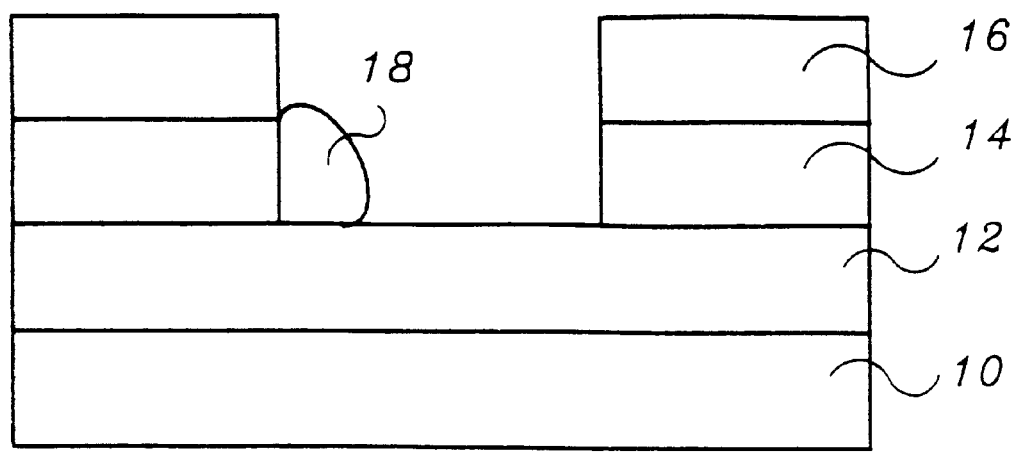
FIG. 1 a cross-sectional view of a semiconductor wafer illustrating the bubbles formed by a conventional reactive ion etching process.
Figure 3:
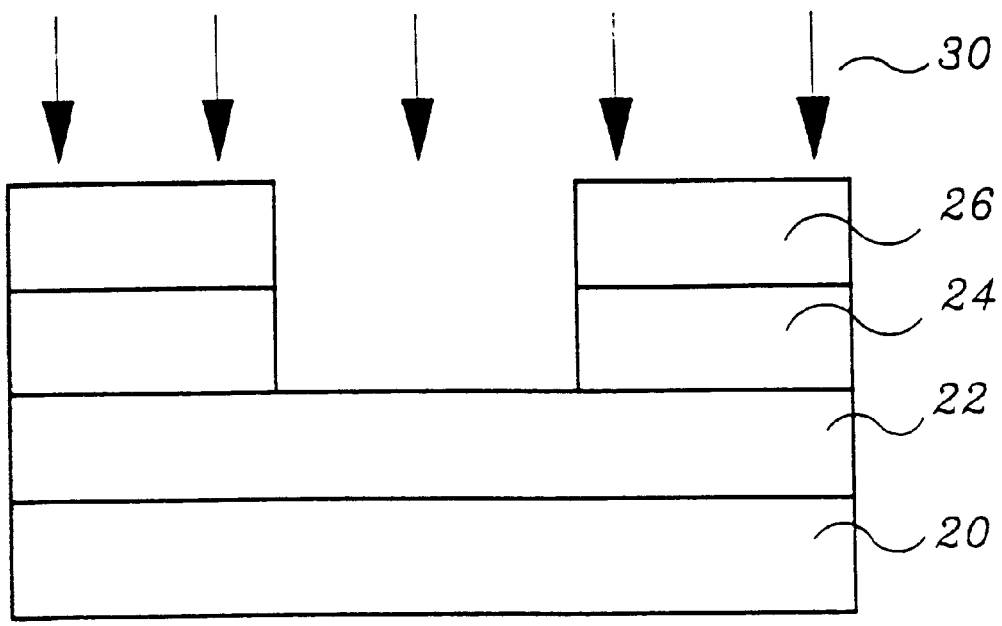

FIG. 3 illustrates the next step of the preferred embodiment of the present invention. In particular, an additional second over-etching step is performed to prevent the undesired byproducts of the prior art, namely bubbles 18 (see FIG. 1) and spots. The additional second over-etching step is done by a nitrogen-based plasma etching process with an etching gas such as $N_2$, NO, $N_2O$, or $NO_2$ vapor, which is indicated by an arrow 30. The preferred concentration, preferred pressure, and preferred temperature of the over-etching vapor is about 10–100 sccm, 200–1000 mT, 60–70° C. Thus, immediately after the RIE step, or after the first over-etching step (if used), the furnace is flushed with a nitrogen species as noted above for preferably between 5 to 15 seconds.

By including the extra step of a nitrogen-based plasma, it has been found that bubbles 18 and spots are eliminated or substantially reduced. Why does the nitrogen-based plasma etching process prevent the undesired byproducts? It is believed that the electrophilic nature of the nitrogen atom is the cause. Specifically, there are two lone-pairs of electrons on a nitrogen atom so that the two lone-pairs of electrons will attack the acid-like sidewall polymer. Thus, the acid-like sidewall polymer is surrounded by nitrogen atoms and has no chance of reacting with the fluorine or carbon atoms remaining from the main etching step 28. Even in a severe ambient such as high humidity and basic outgas, there are no bubbles and spots found nearby the post-etch patterns.

Figure 4:
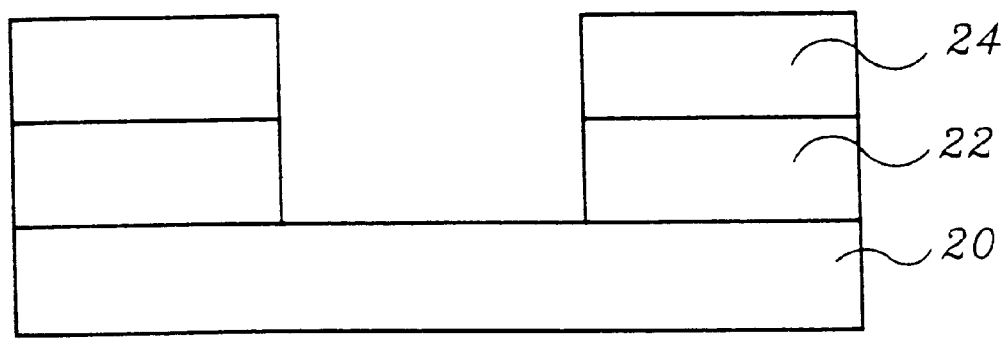

FIG. 4 illustrates one final step in the preferred embodiment of the process. The photoresist layer 26 is removed and the conductive layer 22 is then etched through the openings formed in the dielectric mask 24. Thus, the etched dielectric layer 24 serves as a hard mask. In this embodiment, the etching is performed using a selective etching process with a selectivity ratio of about 50 for the dielectric layer 24 to the conductive layer 22. Unlike the conventional prior art process, the conductive layer 22 uncovered by dielectric layer 24 can be etched completely because no bubbles 18 are formed to mask the etch.

Although specific embodiment has been illustrated and described, it will be obvious to those skilled in the art that various modifications may be made without departing from the which is intended to be limited solely by the appended claims.

The embodiments of the invention in which an exclusive property or privilege is claimed are defined as follows:

1. A method for etching a conductive layer on a substrate, the method comprising the steps of:
   forming an oxide layer on said conductive layer;
   forming and patterning a photoresist layer on said oxide layer;
   etching said oxide layer uncovered by said photoresist by reactive ion etching and forming residues on said conductive layer;
   etching said residues by nitrogen-based plasma;
   removing said photoresist layer after said residues is etched; and
   etching said conductive layer using said oxide layer as a mask.

2. The method according to claim 1 wherein said conductive layer comprises a polysilicon layer.

3. The method according to claim 1 further including the step of over-etching said oxide layer after said oxide layer etching step.

4. The method according to claim 1 wherein said reactive ion etching uses a fluorocarbon containing plasma.

5. The method according to claim 1 wherein said fluorocarbon containing plasma is selected from the group consisting of $CF_4$, $CHF_3$, $CH_2F_2$, and $CH_3F$.

6. The method according to claim 1 wherein said nitrogen-based plasma is selected from the group consisting of $N_2$, NO, $N_2O$, and $NO_2$.

7. The method according to claim 1 wherein said nitrogen-based plasma is performed for between about 5 to 15 seconds.

8. The method according to claim 1 wherein said nitrogen-based plasma etching is performed at a temperature between about 60° C. to 70° C.

9. The method according to claim 1 wherein said nitrogen-based plasma etching is performed at a pressure between about 200 to 1000 mTorr.

10. The method according to claim 1 wherein said residues comprise bubbles and spots generated from the step of etching said oxide layer.

11. The method according to claim 10 further including the step of over-etching said dielectric layer after said dielectric layer etching step.

12. The method according to claim 10 wherein said dielectric layer comprises an oxide layer.

13. The method according to claim 10 wherein said nitrogen-based plasma etching is performed at a temperature between about 60° C. to 70° C.

14. The method according to claim 10 wherein said nitrogen-based plasma etching is performed at a pressure between about 200 to 1000 mTorr.

15. The method according to claim 14 further including the step of over-etching said dielectric layer after said dielectric layer etching step.

16. The method according to claim 14 wherein said dielectric layer comprises an oxide layer.

17. An improved method according to etching a dielectric layer on a substrate, said method comprising the steps of:
   forming and patterning a photoresist layer on said dielectric layer;
   etching portions of said dielectric layer by reactive ion etching and forming polymer residues on an underlying layer;
   etching said polymer residues by nitrogen-based plasma; and
   removing said photoresist layer after said polymer residues is etched.

18. An improved method according to etching a dielectric layer on a substrate, said method comprising the steps of:
   forming and patterning a photoresist layer on said dielectric layer;
   etching portions of said dielectric layer by reactive ion etching and forming residues on an underlying layer, said residues including bubbles and spots generated from etching said dielectric layer;
   etching said residues by nitrogen-based plasma at a temperature between about 60° C. to 70° C. and a pressure between about 200 to 1000 mTorr; and
   removing said photoresist layer after said residues is etched.

* * * * *

UNITED STATES PATENT AND TRADEMARK OFFICE
CERTIFICATE OF CORRECTION

PATENT NO. : 5,990,018  
DATED : November 23, 1999  
INVENTOR(S) : Y.-C. Ho et al.

Page 1 of 2

It is certified that error appears in the above-identified patent and that said Letters Patent is hereby corrected as shown below:

On the title page,

COLUMN    LINE

| COLUMN | LINE | |
|---|---|---|
| Pg. 1, col. 2 | Attorney, Agent or Firm | "Kincness" should read --Kindness-- |
| Item [57] Pg. 1, col. 2 | Abstract 1 of text | "improviding" should read --improving-- |
| Item [57] Pg. 1, col. 2 | Abstract 3 of text | after "plasma" and before "step" insert --etching-- |
| 3 (Claim 1, | 31 line 10) | "residues is" should read --residues are-- |
| 3 (Claim 7, | 50 line 2) | after "plasma" insert --etching-- |
| 4 (Claim 17, | 25 line 1) | "according to" should read --for-- |
| 4 (Claim 17, | 35 line 11) | "residues is" should read --residues are-- |
| 4 (Claim 18, | 36 line 1) | "according to" should read --for-- |

UNITED STATES PATENT AND TRADEMARK OFFICE
CERTIFICATE OF CORRECTION

PATENT NO. : 5,990,018
DATED : November 23, 1999
INVENTOR(S) : Y.-C. Ho et al.

Page 2 of 2

It is certified that error appears in the above-identified patent and that said Letters Patent is hereby corrected as shown below:

COLUMN  LINE

4          47         "residues is" should read --residues are--
(Claim 18, line 12)

Signed and Sealed this

Sixth Day of March, 2001

Attest:

NICHOLAS P. GODICI

Attesting Officer    Acting Director of the United States Patent and Trademark Office